United States Patent
Kim et al.

(12)
(10) Patent No.: US 6,248,667 B1
(45) Date of Patent: Jun. 19, 2001

(54) CHEMICAL MECHANICAL POLISHING METHOD USING DOUBLE POLISHING STOP LAYER

(75) Inventors: Jung-yup Kim, Sungnam; Chang-ki Hong, Suwon, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/527,458

(22) Filed: Mar. 17, 2000

(30) Foreign Application Priority Data

Mar. 18, 1999 (KR) ..................................... 99-9183

(51) Int. Cl.[7] .......................... H01L 21/302; H01L 21/461
(52) U.S. Cl. ..................... 438/690; 438/424; 438/427; 438/692; 438/959
(58) Field of Search .................................. 438/424, 427, 438/690, 691, 692, 959, 970

(56) References Cited

U.S. PATENT DOCUMENTS

| 5,494,857 | | 2/1996 | Cooperman et al. | 438/437 |
|---|---|---|---|---|
| 5,498,565 | * | 3/1996 | Gocho et al. | 438/427 |
| 5,721,172 | * | 2/1998 | Jang et al. | 438/424 |
| 5,728,621 | * | 3/1998 | Zheng et al. | 438/427 |
| 5,817,568 | * | 10/1998 | Chao | 438/427 |
| 5,923,993 | * | 7/1999 | Sahota | 438/427 |
| 6,057,207 | * | 5/2000 | Lin et al. | 438/424 |
| 6,146,975 | * | 11/2000 | Kuehne et al. | 438/437 |

FOREIGN PATENT DOCUMENTS

WO 00/02235 * 1/2000 (WO) .

OTHER PUBLICATIONS

Ishimoto et al., New technique of interlayer dielectric CMP with capping layer, Conference Proceedings of IEEE International Symposium on Semiconductor Manufacturing, 1997, pp. F21–F23.*

* cited by examiner

*Primary Examiner*—Richard Elms
*Assistant Examiner*—Christian D. Wilson
(74) *Attorney, Agent, or Firm*—The Law Offices of Eugene M. Lee, PLLC

(57) ABSTRACT

A chemical mechanical polishing (CMP) method using a double polishing stopper by which it is possible to prevent a dishing phenomenon and a variation in the thickness of a polishing stopper, including the steps of stacking polishing stoppers to form the double polishing stopper on a semiconductor substrate, forming a trench, stacking an isolation layer, performing a first CMP process using a second polishing stopper, removing the second polishing stopper, and performing a second CMP process using a first polishing stopper. It is possible to remove the second polishing stopper by additionally interposing an etching stopper between the polishing stoppers which form the double polishing stopper.

20 Claims, 4 Drawing Sheets

CHEMICAL MECHANICAL POLISHING METHOD USING DOUBLE POLISHING STOP LAYER

BACKGROUND OF THE INVENTION

1. Field of the Invention

The present invention relates to a method for manufacturing a semiconductor device and, more particularly, to a chemical mechanical polishing (CMP) method.

2. Description of the Related Art

High performance and highly integrated semiconductor devices such as 256 mega byte and 1 giga byte dynamic random access memories (DRAM) require ultra large scale integration (ULSI). Technologies for forming fine patterns and three-dimensional multi-layer structures are essential to effectively manufacture highly integrated semiconductor devices. Therefore, it is necessary to introduce a new more efficient and precise process to manufacture semiconductor devices. When multi-layered fine wiring is formed by a pattern forming technology, it is essential to planarize an interlayer dielectric (ILD) layer existing under the fine wiring. A partial planarization processing technology is generally used to planarize a layer of a semiconductor device. More recently, a global planarization technology called chemical mechanical polishing (CMP) for planarizing an entire wafer surface has been in use since the mid 1980's. CMP technology improves processing efficiency of semiconductor devices and the quality of the semiconductor devices formed thereby.

CMP technology is applied in semiconductor device manufacturing, i.e., for planarizing an ILD layer, for planarizing metal wiring, and for planarizing a trench structure in an element isolation process. Accordingly, CMP technology improves the depth of focus (DOF) of exposing light in a photolithography process, allows multi-layer wiring to be formed in fine patterns, and improves the step difference between memory cell areas and adjacent peripheral circuit areas in memory devices. Therefore, after CMP technology was introduced to semiconductor device manufacturing, much development was made with respect to element isolation technology to improve the degree of integration, realize fine pattern structure, and to improve global planarization of multi-wiring semiconductor devices. Due to the above-mentioned advantages of CMP technology, research on CMP equipment, articles of consumption for the CMP equipment, and process design using CMP technology, are continuing.

A trench planarization process of an element isolation process is disclosed in U.S. Pat. No. 5,494,857, titled chemical mechanical planarization of shallow trenches in semiconductor substrates, filed on Feb. 27, 1996 and issued to Digital Equipment Corporation (DEC).

FIGS. 1 and 2 are cross-sectional views describing a CMP method according to conventional technology.

Referring to FIG. 1, a polishing stopper 53 such as a silicon nitride (SiN) layer is formed on a semiconductor substrate. A trench is formed by etching a predetermined area of the semiconductor substrate 51 in order to form the isolation layer. Then, an oxide layer 55 which can operate as the isolation layer is deposited on the semiconductor substrate 51 covering the entire surface of the semiconductor substrate 51. The semiconductor substrate 51 is divided into a field area 12, where a field oxide layer is formed in a relatively wide area, and a pattern area 10 in which a separate element such as a memory cell is formed.

With reference to FIG. 2, an isolation layer 55' for separating adjacent active areas is formed on the surface of the semiconductor substrate by global planarization in which the CMP process is performed on the surface of the semiconductor substrate 51 on which the oxide layer 55 is stacked. In the CMP process, the polishing stopper layer 53, which is formed of a SiN layer, prevents the oxide layer 55 from being polished, by which it is possible to achieve global planarization. To planarize the polishing stopper layer made up of a SiN layer or a boron nitride (BN) layer in the CMP process, silica-based slurry is used. In order to planarize the SiN layer or a polysilicon layer in the CMP process, Ceria-based slurry is used.

However, the CMP method has the following problems. First, a dishing phenomenon (D of FIG. 2) occurs in which a recessed isolation layer 55 and not a flat isolation layer is formed in the field area 12. It is considerably difficult to prevent the occurrence of the dishing phenomenon because the dishing phenomenon occurs naturally even though the CMP process uses a slurry having high polishing selectivity.

Second, a thickness variation of the polishing stopper 53 is generated in the pattern area (A of FIG. 2) which is adjacent to the field area 12. The non-uniform thickness of the polishing stopper 53 deteriorates the electrical performance and the reliability of the semiconductor device when the semiconductor device manufacturing processes are completed.

The present invention is directed to overcoming or at least reducing the effects of one or more of the problems set forth above.

SUMMARY OF THE INVENTION

In accordance with one aspect of the present invention, there is provided a chemical and mechanical polishing (CMP) method using a double polishing stopper, by which it is possible to prevent a dishing phenomenon and the variation of the thickness of a polishing stopper in a CMP process. More specifically, according to a first embodiment of the present invention, a first and second polishing stopper are sequentially stacked, to form a double polishing stopper on a semiconductor substrate. A trench is formed by patterning the first and second polishing stoppers and etching the semiconductor substrate under the first polishing stopper. An isolation layer for covering the semiconductor substrate is stacked on the entire surface of the semiconductor substrate in which the trench was formed. A first CMP process is performed on the isolation layer using the second polishing stopper. The second polishing stopper is removed using the etching selectivity of the second polishing stopper to the first polishing stopper. A second CMP process is performed using the first polishing stopper.

In accordance with another aspect of the present invention, a second polishing stopper and a first polishing stopper are formed of a polysilicon layer and a nitride layer, respectively. The first and second polishing stoppers may be formed of a layer including a polysilicon layer, a silicon nitride (SiN) layer, or a boron nitride (BN) layer. The first and second polishing stoppers are respectively formed to a thickness of between 100 and 10,000 Å.

In accordance with a feature of the present invention, an isolation layer is formed of USG, PSG, BSG, BPSG, and/or an oxide layer using HDP, TEOS, or FOX.

Further, in accordance with another aspect of the present invention, the ratio of the polishing rate of an isolation layer to the polishing rate of a second polishing stopper is larger than 1. The ratio of the etching rate of the second polishing stopper to the etching rate of the isolation layer is larger than 5.

In accordance with still another aspect of the present invention, the ratio of the etching rate of a second polishing stopper to the etching rate of a first polishing stopper is larger than 5. The ratio of the polishing rate of an isolation layer to the polishing rate of the first polishing stopper is larger than 1.

In accordance with another aspect of the present invention, a chemical mechanical polishing (CMP) method using a double polishing stopper is provided. More specifically, a first polishing stopper, an etching stopper, and a second polishing stopper are sequentially stacked on a semiconductor substrate. A trench is formed by patterning the first polishing stopper, the etching stopper, and the second polishing stopper and etching the semiconductor substrate under the first polishing stopper. An isolation layer for covering the semiconductor substrate is stacked on the entire surface of the etched semiconductor substrate. A first CMP process is performed on the isolation layer using the second polishing stopper. The second polishing stopper is removed using the etching stopper. A second CMP process is performed on the isolation layer and the etching stopper using the first polishing stopper.

In accordance with yet another aspect of the present invention, a second polishing stopper is formed of a material different from that of a first polishing stopper. The first and second polishing stoppers are formed of a layer including a polysilicon layer, a SiN layer, or a BN layer. The first and second polishing stoppers are respectively formed to a thickness of between 100 and 10,000 Å.

Further, in accordance with another feature of the present invention, an etching stopper and an isolation layer are preferably formed of USG, PSG, BPSG, an oxide layer using HDP, TEOS, or FOX.

In yet another aspect of the present invention, the ratio of the polishing rate of an isolation layer to the polishing rate of a second polishing stopper is larger than 1. The ratio of the etching rate of the second polishing stopper to the etching rate of the isolation layer is larger than 5. The ratio of the etching rate of the second polishing stopper to the etching rate of the isolation layer is larger than 5. The ratio of the polishing rate of the isolation layer to the polishing rate of a first polishing stopper is larger than 1.

According to the present invention, it is possible to improve the performance of the semiconductor device by preventing the occurrence of the dishing phenomenon in a field area in which a field oxide layer is formed and reducing the variation in thickness of the polishing stopper in an area in which the field area is adjacent to a pattern area.

BRIEF DESCRIPTION OF THE DRAWINGS

The above features and advantages of the present invention will become more apparent by describing in detail preferred embodiments thereof with reference to the attached drawings in which.

DESCRIPTION OF THE PREFERRED EMBODIMENTS

Applicant's Korean application no.99-9183 filed Mar. 18, 1999, is incorporated herein by reference as if set forth fully herein.

The term "CMP method" referred to in the present specification is used in its widest sense and is not limited to a specific process such as a trench isolation layer process. The present invention can be realized by other methods within the scope and spirit of the present invention. For example, the CMP method using the double polishing stopper is applied to the trench isolation process in the following preferred embodiment. However, it can be applied to a process of planarizing the interlayer dielectric (ILD) layer, a shallow trench isolation process, or a damascene process. Therefore, the contents described in the following preferred embodiments are not restrictive but illustrative.

Preferred Embodiment; a case of using a double polishing stopper

FIGS. 3 through 6 are cross-sectional views each showing a step describing a CMP method using a double polishing stopper according to a first embodiment of the present invention.

Figure 1:
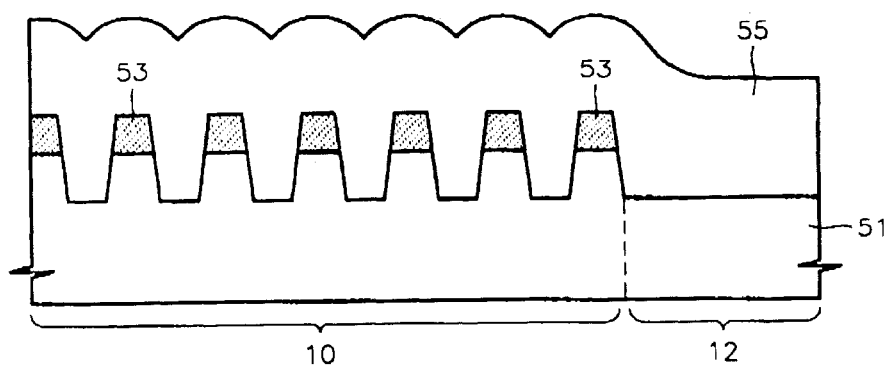
FIGS. 1 and 2 are cross-sectional views showing a chemical mechanical polishing (CMP) method according to conventional technology and a problem thereof.
Figure 2:
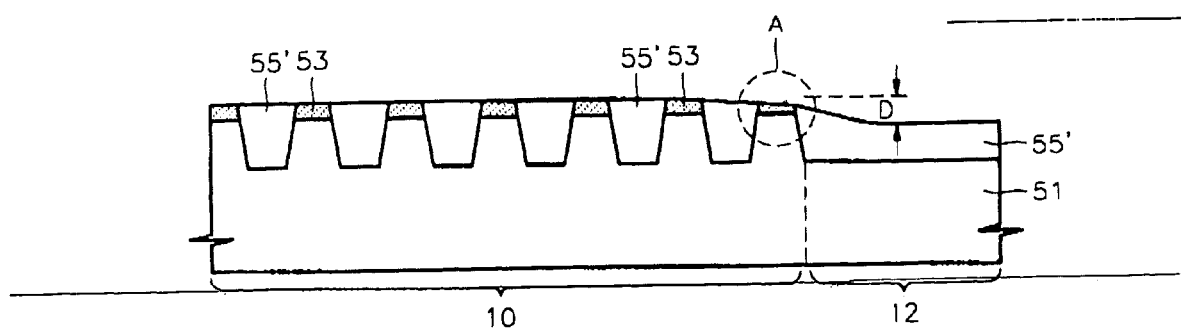
Figure 3:
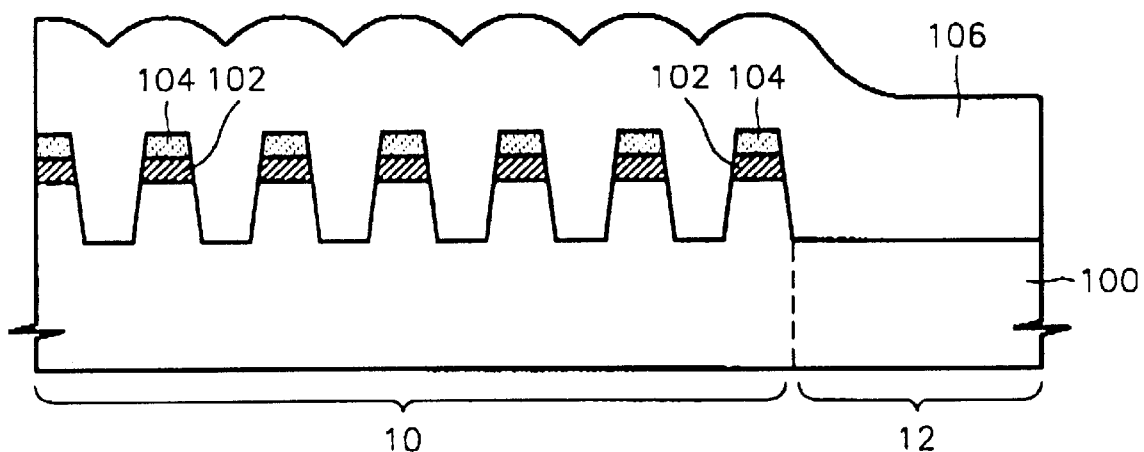
FIGS. 3 through 6 are cross-sectional views, each showing a step describing a CMP method using a double polishing stopper according to a first embodiment of the present invention.

Referring to FIG. 3, a first polishing stopper 102 formed from a SiN layer, and a second polishing stopper 104 formed from a polysilicon layer, are sequentially stacked on a semiconductor substrate 100 having a pattern area 10 and a field area 12. The thickness of the first and second polishing stoppers 102 and 104, respectively, can be controlled to be within 100 to 10,000 Å thick. In the present embodiment, the first and second polishing stoppers 102 and 104, respectively, are formed to a thickness of 1,500 Å. Also, the first and second polishing stoppers 102 and 104, respectively, can be formed of an arbitrary layer selected from a polysilicon layer, a SiN layer, or a BN layer. Since Ceria-based slurry is used in the present invention, the first polishing stopper 102 is formed from a SiN and the second polishing stopper 104 is formed from a polysilicon layer. Conversely, when the first polishing stopper 102 is formed of a BN layer and the second polishing stopper 104 is formed of a SiN layer, it is preferable to use a silica-based slurry. A trench is formed in the pattern area 10 and the field area 12 by patterning the first and second polishing stoppers 102 and 104 and etching the semiconductor substrate 100.

Then, an isolation layer 106 is stacked on the entire surface of the semiconductor substrate 100 in which the trench was formed, to cover the entire surface of the semiconductor substrate 100. The isolation layer 106 is formed from either an undoped silicate glass (USG), phosphorus silicate glass (PSG), boron silicate glass (BSG), boron phosphorus silicate glass (BPSG), an oxide layer using high density plasma (HDP), TEOS, or FOX. In the present invention, the isolation layer 106 is formed from USG. When the isolation layer 106 is selected, it should have a polishing rate larger than those of the first and second polishing stoppers 102 and 104 respectively. The isolation layer 106 is formed of a material having an etching rate five times lower than that of the second polishing stopper 104. Also, the isolation layer 106 is preferably formed of a layer selected such that the ratio of the etching rate of the second polishing stopper to the etching rate of the first polishing stopper is larger than 5.

Figure 4:
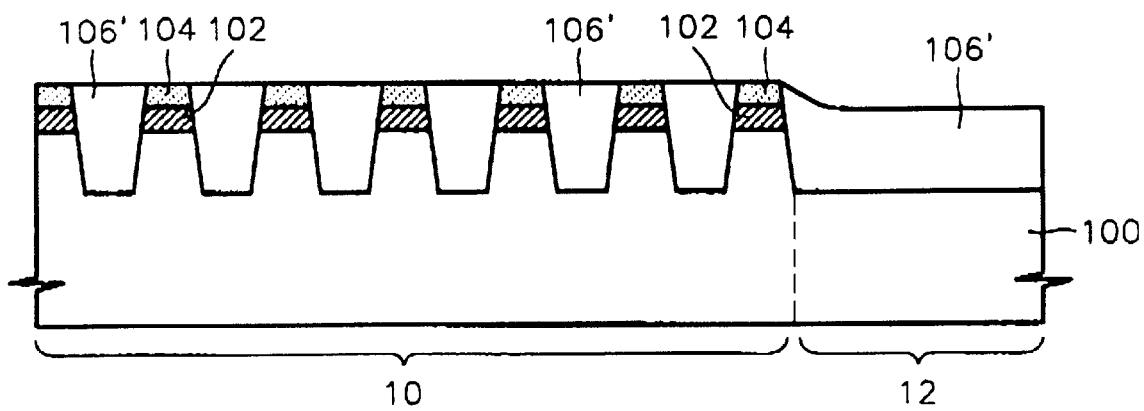

As shown in FIG. 4, a first CMP process is performed using a Ceria-based slurry having high selectivity instead of a generally used silica-based slurry. Since the polishing rate of the isolation layer 106 is higher in the field area 12 than in the pattern area 10, the polishing is stopped by the second polishing stopper 104. Isolation layer 106 shown in FIG. 3 becomes isolation layer 106' after polishing. When the second polishing stopper 104 is formed of the SiN layer and the first polishing stopper 102 is formed of the BN layer, the silica-based slurry is used. However, a dishing phenomenon, in which the surface of the field area 12 is recessed, still occurs in the field area in which the isolation layer is relatively widely formed.

Figure 5:
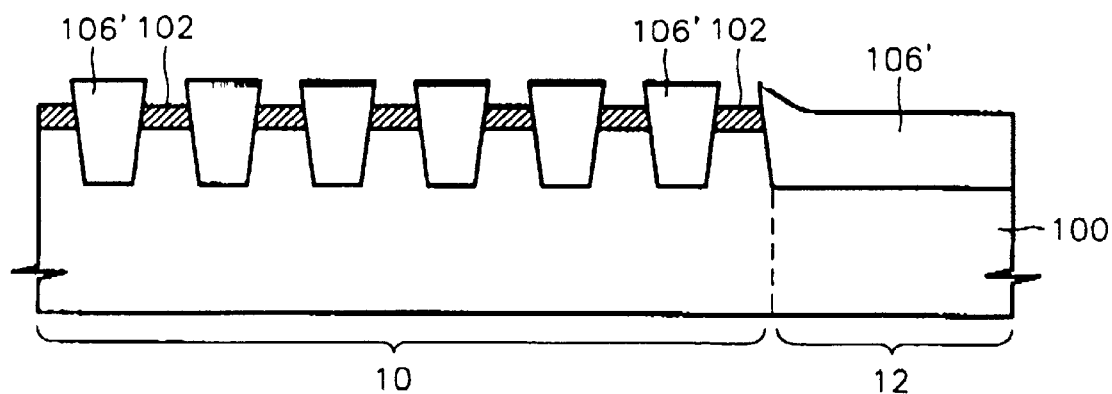

Next, as can be seen in FIG. 5, the second polishing stopper 104 is removed by wet etching. The wet etching is performed using a characteristic in which the etching rate of the second polishing stopper 104 is five times faster than that of the isolation layer 106 and the first polishing stopper 102. Therefore, in the present invention, it is possible to completely remove the second polishing stopper 104 by wet etching for about 30 minutes using a mixture of $HNO_3$+$HF$+$CH_3COOH$ as an etchant. In the present invention, the second polishing stopper 104 is removed by the wet etching method, however, it can also be removed by the dry etching.

Figure 6:
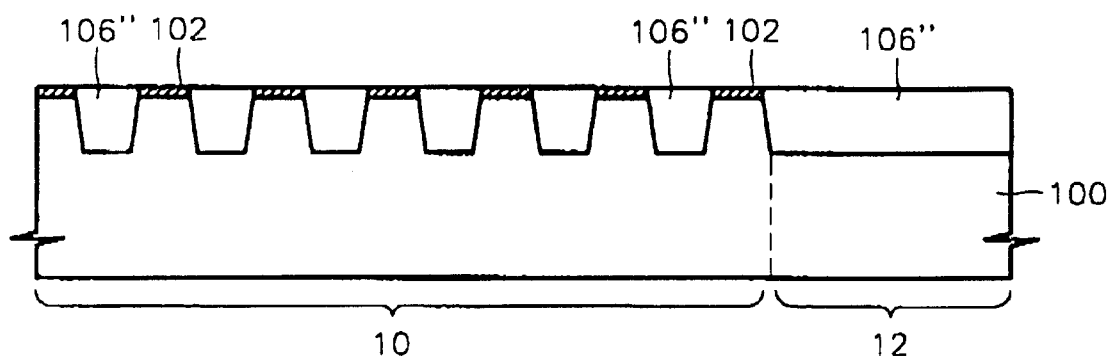

Further, as can be seen in FIG. 6, a second CMP process is performed on the surface of the semiconductor substrate which underwent the wet etching using the Ceria-based slurry for a high etch selectivity. Here, the first polishing stopper 102 formed of polysilicon, is not easily abraded. The second CMP process is performed using a slurry which can easily remove the isolation layer 106', which are in the form of pillars that protrude to the same height. Since the thickness of the isolation layer 106' removed by the second CMP process is negligible, the dishing phenomenon does not occur in the field area 12. The isolation layer 106' becomes isolation layer 106" after the second polishing. It is possible to realize an improved trench isolation process in which the variation of the thickness of the polishing stopper in an adjacent portion between the pattern area and the field area is smaller than in the conventional trench isolation process even after the formation of the isolation layer 106".

Another Preferred Embodiment; a case of using the double polishing stopper together with the etching stopper The first polishing stopper was removed by forming the double polishing stopper of different materials in the first embodiment. However, in the second embodiment, the first polishing stopper is removed by interposing an etching stopper 210 between the first polishing stopper 202 and the second polishing stopper 204 since the double polishing stopper is formed of the same material. Here, description of the same elements as those in the first embodiment will be omitted. Also, reference numerals are designated to correspond to those of the first embodiment in order to facilitate understanding.

FIGS. 7 through 10 are cross-sectional views, each showing a step describing the CMP method using the double polishing stopper according to the second embodiment of the present invention.

Figure 7:
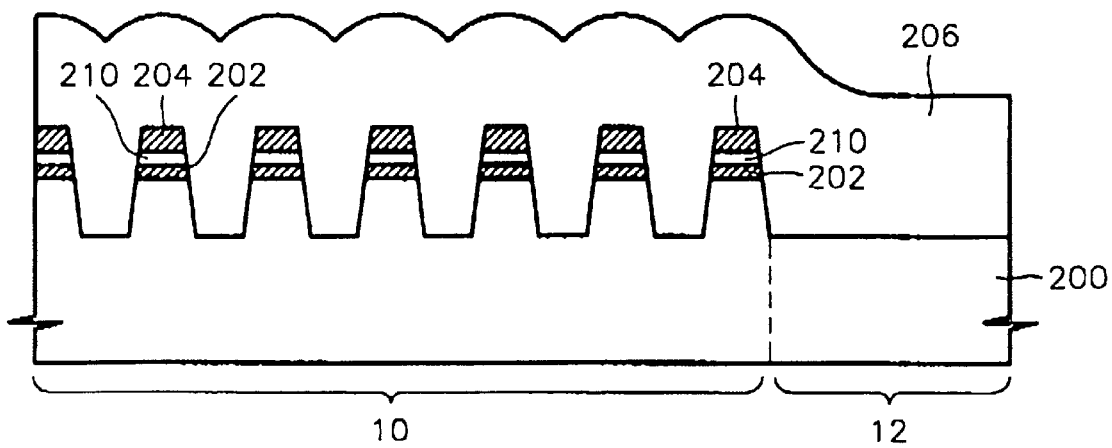
FIGS. 7 through 10 are cross-sectional views, each showing a step describing a CMP method using a double polishing stopper according to a second embodiment of the present invention.

Referring to FIG. 7, the first polishing stopper 202, the etching stopper 210, and the second polishing stopper 204 are sequentially stacked on a semiconductor substrate 200. The etching stopper 210 is formed from a USG selected from an insulating layer group consisting of USG, PSG, BSG, BPSG, and/or an oxide layer using HDP, TEOS, and FOX. The thickness of the etching stopper 210 is controlled to be between 100 and 10,000 Å. In the present invention, the etching stopper 210 is formed to a thickness of between 1,500 and 2,000 Å. The trench is formed by patterning the second polishing stopper 204, the etching stopper 210, and the first polishing stopper 202. Then, a thick isolation layer 206 is formed on the entire semiconductor substrate 200.

Figure 8:
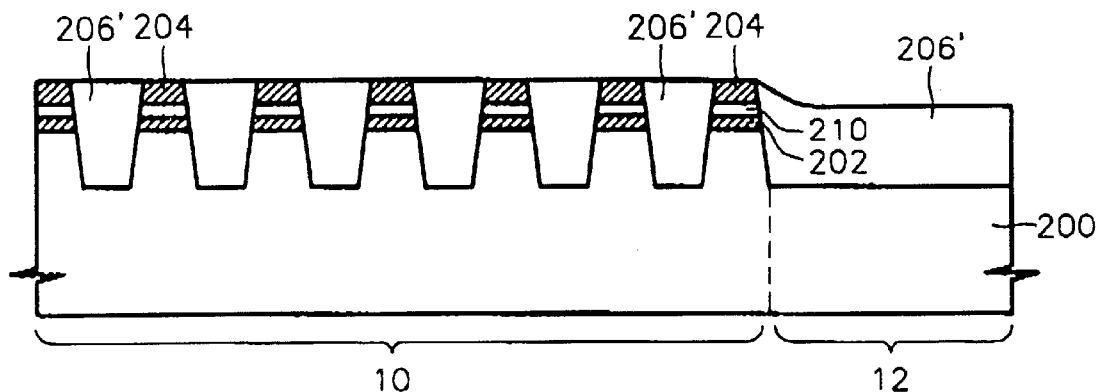

Referring to FIG. 8, the first CMP process is performed using the polishing selectivity. At this time, the second polishing stopper 204 operates as the stopping layer in the pattern area 10, however, the dishing phenomenon occurs in the field area 12 as in the conventional process.

Figure 9:
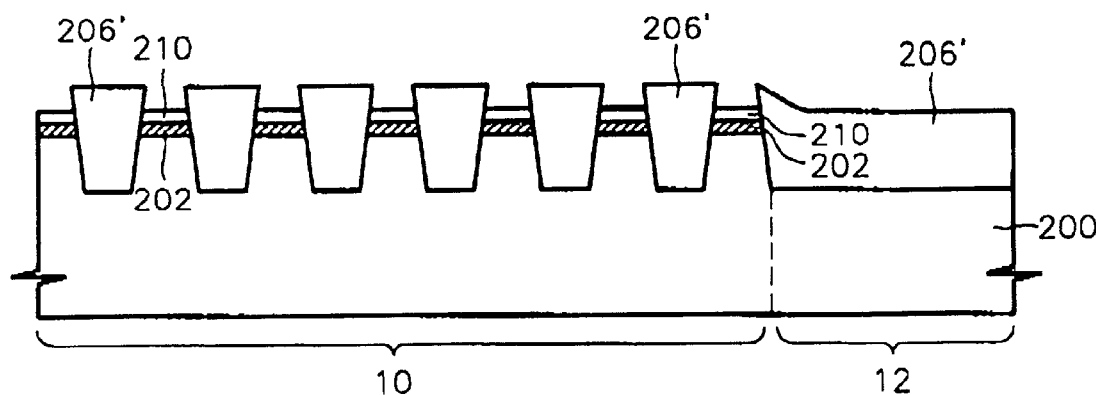

Referring to FIG. 9, the second polishing stopper 204 is removed using the etching selectivity of the etching stopper 210 and the isolation layer 206' to the second polishing stopper 204. At this time, wet etching using $H_3PO_4$ can be performed for 30 minutes in the case that the first polishing stopper 202, second polishing stopper 204 is SiN or BN. Such wet etchant may be replaced with the mixture of $HNO_3$+$HF$+$CH_3COOH$ in the case that the first polishing stopper 202, second polishing stopper 204 is polysilicon.

Figure 10:
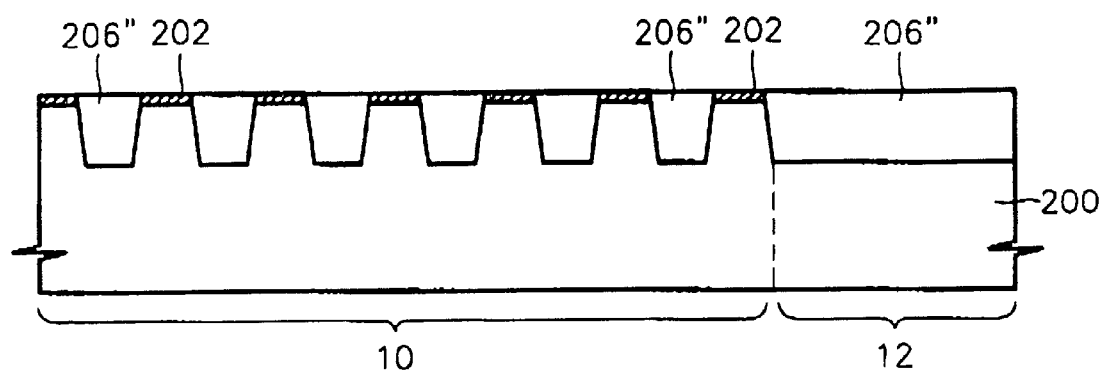

Referring to FIG. 10, the isolation layer 206" is formed by removing the surface of the isolation layer 206' and the etching stopper 210 by performing the second CMP process on the semiconductor substrate 200 from which the second polishing stopper 204 has been removed. At this time, the generation of dishing in the field area is prevented and the variation in thickness of the polishing stopper is reduced in the portion between the field area 12 and the pattern area 10.

Therefore, according to the above-mentioned present invention, it is possible to prevent the generation of the dishing phenomenon in the field area in which a field oxide layer is formed. Second, it is possible to improve the performance of the semiconductor device by reducing the variation of the thickness of the polishing stopper in the portion between the field area and the pattern area.

The present invention is not restricted to the above embodiments, and it is clearly understood that many variations are possible within the scope and spirit of the present invention by anyone skilled in the art.

Thus, a CMP method using a double polishing stop layer has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A chemical mechanical polishing (CMP) method using a double polishing stopper, comprising the steps of:
   (a) forming a first polishing stopper layer on a semiconductor substrate;
   (b) forming a second polishing stopper layer on the first polishing stopper layer;
   (c) forming a trench by patterning the first and second polishing stopper layers and etching the semiconductor substrate below the first polishing stopper layer;
   (d) forming an isolation layer over the semiconductor substrate in which the trench was formed;
   (e) performing a first CMP process using the etched second polishing stopper layer;
   (f) removing the etched second polishing stopper layer; and
   (g) performing a second CMP process using the etched first polishing stopper layer.

2. The method of claim 1, wherein the second polishing stopper layer is formed of a material different from that of the first polishing stopper layer.

3. The method of claim 2, wherein the second polishing stopper layer is formed of a layer including at least one member of an insulating layer group consisting of a polysilicon layer, a silicon nitride (SiN) layer, and a boron nitride (BN) layer.

4. The method of claim 2, wherein the first polishing stopper layer is formed of a layer including at least one member of an insulating layer group consisting of a polysilicon layer, a SiN layer, and a BN layer.

5. The method of claim 1, wherein the first and second polishing stopper layers are respectively formed to a thickness of between 100 and 10,000 Å.

6. The method of claim 1, wherein the isolation layer is formed of a layer selected from an insulating layer group consisting of USG, PSG, BSG, BPSG, an oxide layer using HDP, TEOS, and FOX.

7. The method of claim 1, wherein the ratio of the polishing rate of the isolation layer to the polishing rate of the second polishing stopper layer is larger than 1.

8. The method of claim 1, wherein the ratio of the etching rate of the second polishing stopper layer to the etching rate of the isolation layer is larger than 5.

9. The method of claim 1, wherein the ratio of the etching rate of the second polishing stopper layer to the etching rate of the first polishing stopper layer is larger than 5.

10. The method of claim 1, wherein the ratio of the polishing rate of the isolation layer to the polishing rate of the first polishing stopper layer is larger than 1.

11. A chemical mechanical polishing (CMP) method using a double polishing stopper comprising the steps of:

(a) forming a first polishing stopper layer on a semiconductor substrate;

(b) forming an etching stopper layer on the first polishing stopper layer;

(c) forming a second polishing stopper layer on the etching stopper layer;

(d) forming a trench by patterning the second polishing stopper layer, the etching stopper layer, and the first polishing stopper layer and etching the semiconductor substrate below the first polishing stopper layer thereby forming a double polishing stopper;

(e) forming an isolation layer over the semiconductor substrate in which the trench was formed;

(f) performing a first CMP process on the isolation layer using the etched second polishing stopper layer;

(g) removing the second polishing stopper layer using the etched etching stopper layer; and (h) performing a second CMP process on the isolation layer and the etched etching stopper layer using the first polishing stopper layer.

12. The method of claim 11, wherein the first and second polishing stopper layers are formed of the same material.

13. The method of claim 12, wherein the first and second polishing stopper layers are formed of a layer including at least one element of a group consisting of a polysilicon layer, a SiN layer, and a BN layer.

14. The method of claim 11, wherein the first and second polishing stopper layers are respectively formed to a thickness of between 100 and 10,000 Å.

15. The method of claim 11, wherein the etching stopper layer is formed of a layer selected from an insulating layer group consisting of USG, PSG, BPSG, an oxide layer using HDP, TEOS, and FOX.

16. The method of claim 11, wherein the isolation layer is formed of a layer selected from an insulating layer group consisting of USG, PSG, BSG, BPSG, an oxide layer using HDP, TEOS, and FOX.

17. The method of claim 11, wherein the ratio of the polishing rate of the isolation layer to the polishing rate of the second polishing stopper layer is larger than 1.

18. The method of claim 11, wherein the ratio of the etching rate of the second polishing stopper layer to the etching rate of the isolation layer is larger than 5.

19. The method of claim 11, wherein the ratio of the etching rate of the second polishing stopper layer to the etching rate of the isolation layer is larger than 5.

20. The method of claim 11, wherein the ratio of the polishing rate of the isolation layer to the polishing rate of the first polishing stopper layer is larger than 1.

\* \* \* \* \*